United States Patent [19]

Ridkosil

[11] Patent Number: 5,231,397
[45] Date of Patent: Jul. 27, 1993

[54] EXTREME WAVEFORM CODING

[75] Inventor: Frank Ridkosil, Hackensack, N.J.

[73] Assignee: Datajet, Inc., Los Angeles, Calif.

[21] Appl. No.: 770,922

[22] Filed: Oct. 4, 1991

Related U.S. Application Data

[63] Continuation-in-part of Ser. No. 406,585, Sep. 13, 1989, Pat. No. 5,055,845, which is a continuation-in-part of Ser. No. 274,605, Nov. 18, 1988, abandoned, which is a continuation of Ser. No. 595,255, Mar. 30, 1984, abandoned.

[51] Int. Cl.⁵ .............................................. H03M 1/12
[52] U.S. Cl. ..................................... 341/155; 341/132
[58] Field of Search ..................... 341/155, 157, 132; 381/36, 37, 38, 40, 41, 42, 49; 364/484

[56] References Cited

U.S. PATENT DOCUMENTS

| | | |
|---|---|---|
| 3,692,983 | 9/1972 | Cucciati et al. . |
| 4,198,608 | 4/1980 | Comley . |
| 4,339,727 | 7/1982 | Kage et al. . |
| 4,367,457 | 1/1983 | Tadauchi et al. ................... 341/132 |
| 4,565,993 | 1/1986 | Brian . |
| 4,789,838 | 12/1988 | Cheng . |
| 4,802,225 | 1/1989 | Patterson ............................. 381/41 |
| 4,804,939 | 2/1989 | Cake et al. . |
| 5,055,845 | 10/1991 | Ridkosil ............................. 341/155 |

FOREIGN PATENT DOCUMENTS 2020517 11/1979 United Kingdom .
2084483 4/1982 United Kingdom .

Primary Examiner—A. D. Pellinen
Assistant Examiner—Brian K. Young
Attorney, Agent, or Firm—Burns, Doane, Swecker & Mathis

[57] ABSTRACT

A circuit and method for representing in digital form information about the time and amplitude characteristic of a time-varying input signal. The time-varying input signal is delayed and the magnitudes of the time-varying input signal and its delayed version are compared to produce a digital signal representing the time characteristic of the input signal in the form of a transition in a digital output signal each time the magnitudes of the compared signals have a predetermined relationship. The predetermined relationship may be a condition of approximate equality or when the magnitude of the larger of the compared signals becomes less than the magnitude of the smaller of the compared signals. The invention also includes a circuit for outputting a digital representation of the amplitude of the time-varying input signal for each transition of said digital output signal. The disclosed circuits thus provide separate digital representations of the time and amplitude of each peak and valley of an analog or other time-varying input signal. The invention also includes an application of the analog-to-digital converter in a pitch tracking circuit.

11 Claims, 11 Drawing Sheets

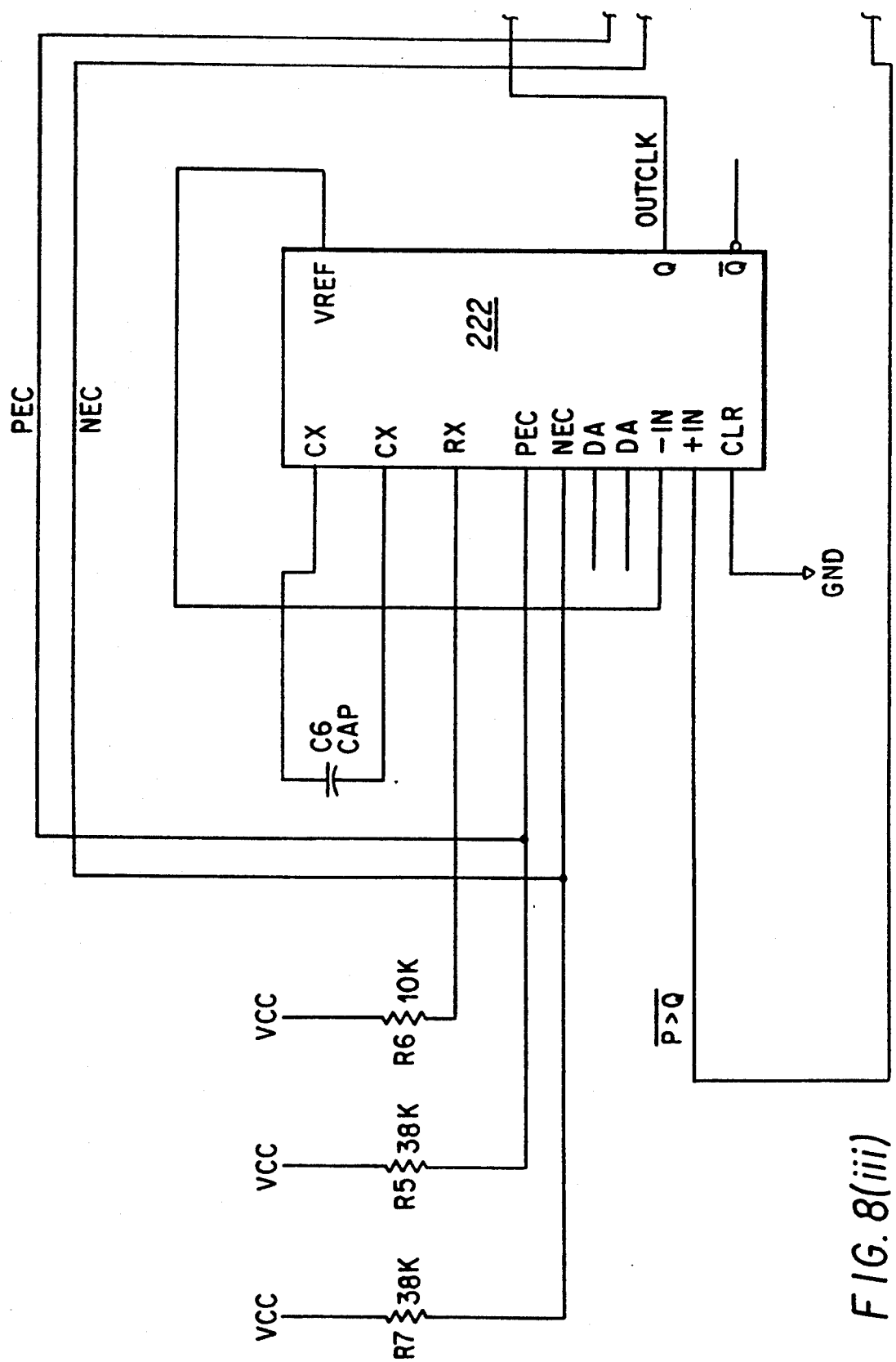
FIG. 8(iii)

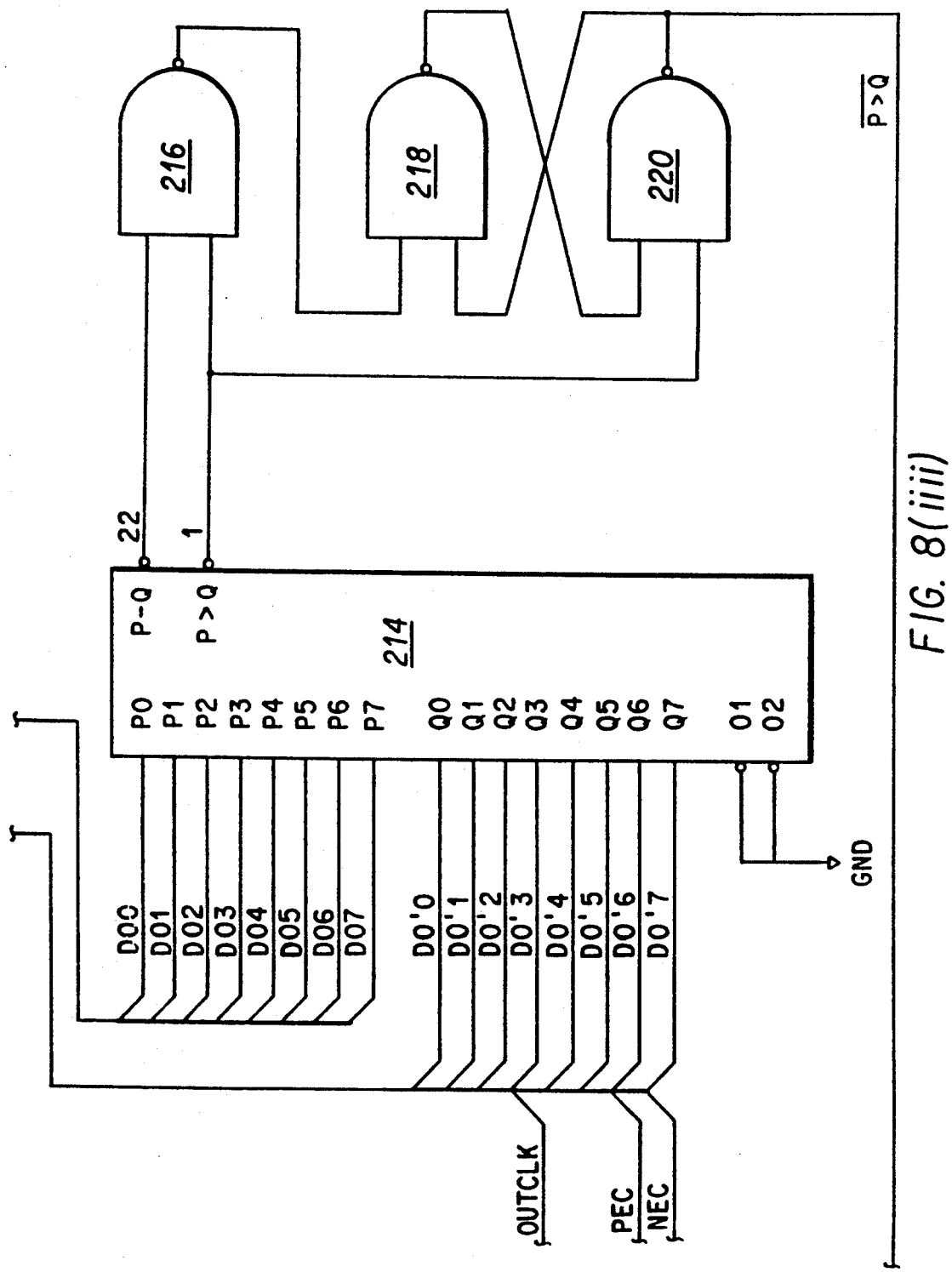
FIG. 8(iiii)

EXTREME WAVEFORM CODING

BACKGROUND OF THE INVENTION

1. Related Applications

This application is a continuation-in-part of U.S. patent application Ser. No. 07/406,585 now U.S. Pat. No. 5,055,845, filed Sep. 13, 1989 by Frank Ridkosil, which application is a continuation-in-part of U.S. patent application Ser. No. 07/274,605 now abandoned, filed Nov. 18, 1988 by Frank Ridkosil, which application is a continuation of U.S. patent application Ser. No. 06/595,255, filed Mar. 30, 1984, now abandoned.

2. Field of the Invention

This invention relates generally to a method and system for digitizing signals and, more particularly, to a method and system for extracting time and amplitude information from an analog signal and providing separate digital representations thereof.

Signal digitizing circuits such as analog to digital converters are used in a variety of applications, particularly in communications. For example, speech or other analog signals are increasingly represented by digital values for storage, transmission, or the like. Of course, the original analog signal must be converted to a digital form prior to such storage or transmission.

One common way to digitize an analog signal is to sample the signal at a regularly repeating sampling interval, determine the magnitude of each sample, and represent the magnitude in a digital form such as binary or binary coded decimal. The digital representation of the analog signal thus is a sequence of magnitudes of the signal, each expressed as a binary word or in some other suitable digital format, where the time between each digital magnitude is uniform and is a function of the rate of the clock used to sample the analog signal.

It will be appreciated that with such an analog-to-digital conversion system, to achieve any useful degree of accuracy in signal reproduction, the clock or sampling rate of the system must be considerably higher than the highest expected frequency of the analog signal. Otherwise, complete half-cycles or cycles of the analog signal may be lost, or at least insufficient information about signal reversals will be available in digital form to accurately reproduce the analog signal. It will also be appreciated that the number of samples will be a function of the clock rate and not the signal being digitized. Therefore, an audio signal having a wide dynamic frequency range will have many more samples per cycle for signals at the low frequency end than for signals at the high frequency end.

SUMMARY OF THE INVENTION

It is an object of the present invention to provide a simple analog-to-digital signal conversion circuit.

It is another object of the present invention to provide a novel method and system for digitizing analog signals wherein the amount of data required to accurately represent the analog signal is minimized.

It is a further object of the present invention to provide a novel method and system for extracting time information from an analog signal and representing such information in digital form.

It is yet another object of the present invention to provide a novel method and system for detecting the peaks and valleys of an analog signal.

It is still another object of the present invention to provide a novel method and system for extracting time and amplitude information from an analog signal wherein the extracted time information is separate from the amplitude information, and the extracted time and amplitude information can be manipulated independently of each other.

The foregoing and other objects are achieved by this invention which, in accordance with one embodiment, digitizes an analog signal and produces a binary signal responsive to the analog signal. The binary signal represents the time between peaks and valleys of the analog signal and appears as a sequence of binary states corresponding to the peaks and valleys of the analog waveform. Advantageously, the binary signal changes state each time there is a reversal of the analog signal, i.e., a peak or valley, whether the reversal occurs at a negative or positive voltage level, i.e., whether the amplitude of the peak or valley is negative or positive.

According to the invention, the analog signal and a delayed version of the analog signal are compared. Each time the amplitudes of the compared signals are substantially equal or differ by some predetermined value, this condition is detected as an indication of the time or frequency component of the analog signal. Since the condition of equality or near equality of the analog signal and its delayed version occurs at a peak or valley, an output signal, preferably a binary level change for each condition of equality or near equality, will provide the time between peaks and valleys of the analog signal. The amplitude of the analog signal can be sampled at the time of each binary level change to provide, as a separate output, the amplitude of each peak and valley.

In one highly advantageous embodiment of the invention, digitizing circuitry is provided with a preamplifier for receiving an analog version of an incoming signal. The preamplifier is coupled at its output to a bistate circuit which produces a sequence of binary states corresponding to the peaks and valleys of the incoming analog signal. The preamplifier is formed of an amplifier having inverting and noninverting inputs and outputs. The noninverting input is coupled to a reference potential, and the analog signal is received at the inverting input terminal. Thus, the analog signal provided at the output of the preamplifier is an inversion.

The bistate circuit also comprises a comparator having inverting and noninverting inputs, and an output; the inputs and the output being connected to each other via a resistive divider circuit. In a preferred embodiment, the noninverting input of the comparator in the bistate circuit is coupled to the node of the resistive divider circuit. Also a capacitor is connected at one terminal thereof to the node, and at its other terminal to a reference potential. The values of the resistors in the resistive divider circuit, and the capacitor may be selected to produce a response time illustratively on the order of microseconds. Such a time constant governs the transitions between the binary states of the binary signal.

Of course, it will be appreciated that the delay between the analog signal and its delayed version can be introduced by a variety of means. One such means disclosed hereinafter is a digital circuit that samples the analog signal and introduces a digital delay of one clock pulse. Such a system is particularly advantageous because it may be used with a variety of analog signals in different applications merely by adjusting the clock rate as a function of the highest expected frequency of the analog input signal. For example, the clock rate may be set at about twice the highest expected frequency of the analog input signal, and preferably higher.

The present invention provides a high speed digitizing system which produces transitions between the binary states illustratively on the order of microseconds. From the standpoint of digital signal processing for applications where only time, e.g., frequency or phase information, is important, overall processing speed is substantially increased and circuit complexity is substantially decreased by permitting the extraction of time information without the need to process amplitude information. Also, in applications where only time information is necessary, data compaction is achieved directly in the conversion circuit. The present digitizing arrangement therefore provides significant advantages and economy over conventional systems such as those which utilize expensive and complex filter banks.

BRIEF DESCRIPTION OF THE DRAWINGS

Comprehension of the invention is facilitated by reading the following detailed description in conjunction with the annexed drawings, in which.

DETAILED DESCRIPTION OF THE PREFERRED EMBODIMENTS

Figure 1:
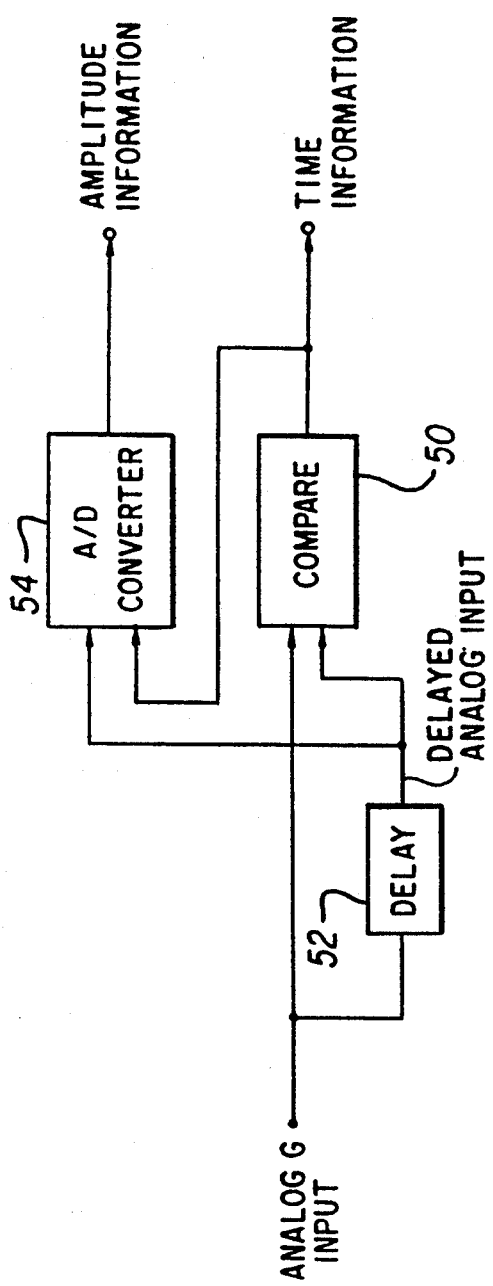
FIG. 1 is a functional block diagram generally illustrating the principles of the present invention.

The zero-crossing technique is computationally far less expensive than the more accurate method of linear prediction or spectral estimation. But zero-crossing or clipped speech does not have all the information of the original signal (complex zeros are lost), yet it preserves the intelligibility of the speech and therefore has the potential for speech recognition. The information pertaining to formants, pitch frequencies and voiced phonemes (vowels) are lost and no direct amplitude is obtained, reproduction of good quality speech is impossible.

On the other hand, direct application of sampling theorem leads to Pulse Code Modulation (PCM). A speech signal, whose energy is mostly contained in the range of 300 Hz to 3400 Hz, is sampled at a rate of 8000 samples per second. Quantitization to 256 levels (8 bits) produces digital speech with a data rate of 64 kbit/s. This speech can be reproduced with good quality but is a complex process when used for speech recognition.

In the case of A12H, if logarithmic quantizer is used, the actual sampling rate may be 8000 samples per second, but the virtual sampling rate will be approximately 500 samples per second. Nonuniform in time but directly related to amplitude and thus giving us a data rate of 8 kbit/s (8 bit amplitude, 8 bit time). This speech can be reproduced with good quality and the data can be used with relative ease for many types of speech recognition.

A direct representation of data (amplitude, time) of the A12H device leads to further compression techniques. In Formant Vocoding, the data rate is reduced by invoking reduction of redundancy on the spectral envelope parameters. In this case, data rates as low as 600 bit/s are achievable but the resultant lack of naturalness is mainly due to the interpolation procedures being inadequate to properly reproduce the transient nature of the speech. The A12H may be able to overcome this inadequacy.

Furthermore, the A12H data may lead to a Reliable Pitch Analysis which may evolve into natural Phonetic Classification and thus approach the actual information rate of speech (approximately 60 bit/second). This application of the A12H is further described with respect to FIGS. 9 and 10 below.

Actual and Potential A12H Applications

1. Communication Systems
  a. FM demodulation
  b. AM demodulation
  c. PPM and other pulse-time modulations
  d. PAM and other phase-amplitude modulations
  e. Antenna and radar design
  f. Fiber optic transmissions
  g. Symmetrical communication (high speed)
  h. Phase Locked Loops
  i. Noise analysis
  j. Statistical multiplexers
  k. Real-Time Front End for DSP
2. Image Signal Processing
  a. Digital filter design
  b. Optical signal recognition
  c. Optical data compression
  d. Reconstruction from edges
3. Speech Signal Processing
  a. Multi rate digital filters
  b. Data compression
  c. Formant representation
  d. Pitch detection
  e. Voice/unvoiced separation
  f. Phonetic recognition
  g. Phonetic speech store and forward
  h. Word spotting
  i. Speaker independent recognition
  j. Speaker identification
4. Other
  a. Waveform generation
  b. Cybernetics
  c. Geophysics
  d. Meteorology
  e. Nuclear physics
  f. Queuing
  g. Spectral/Time analysis h. Holography
i. Astronomy
j Multidimensional signal processing
k. Underwater acoustics
l. Noise cancellation
m. Biomedical
n. Seismic data processing
o. Digital Signal Processing Referring to FIG. 1, an analog input signal of the type, for example, encountered in voice communications, is applied to one input terminal of a suitable conventional signal compare or comparator circuit 50. The analog signal also is applied through a suitable conventional delay circuit 52 to a second input terminal of the compare circuit 50. The output signal of the delay circuit 52 also is applied to the data input terminal of a suitable conventional analog to digital (A/D) converter 54. The output signal from the compare circuit 50 is provided as a time information output signal and is also applied to a trigger input terminal of the A/D converter 54. The digital output signal from the A/D converter 54 is supplied as the amplitude information output signal.

Figure 1A:
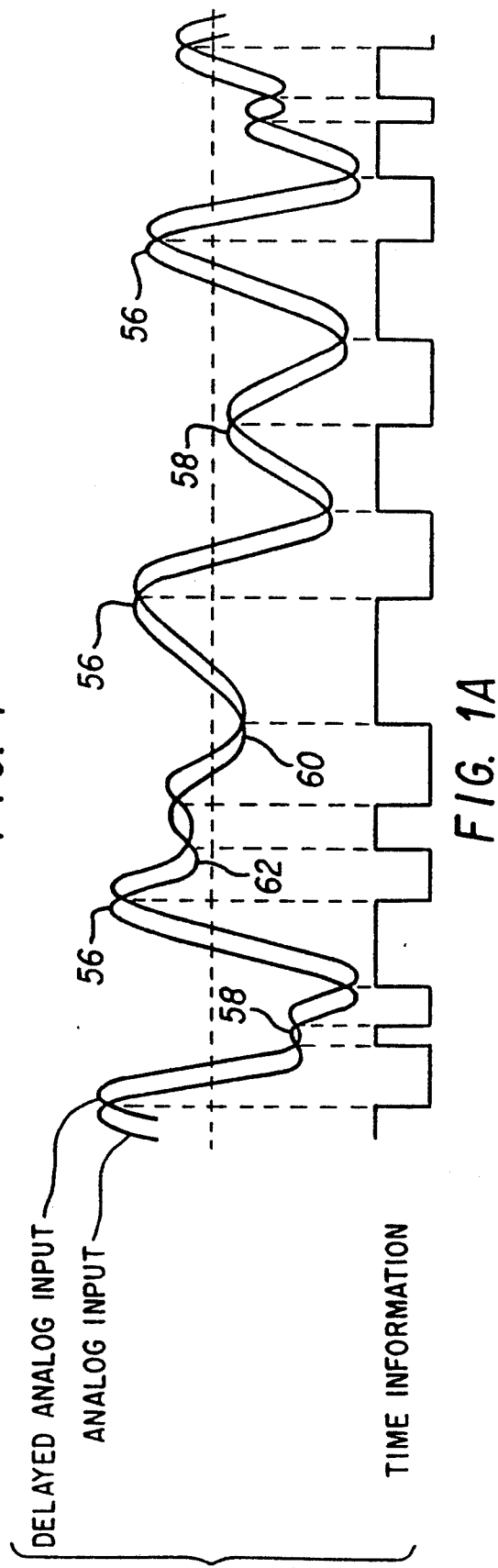
FIG. 1A is an illustration of typical waveforms of signals processed in accordance with the principles of FIG. 1.

The operation of the invention as embodied in FIG. 1 may be more fully appreciated with reference to FIG. 1A which illustrates the signals applied to and produced by the circuit of FIG. 1. The analog input is illustrated as a signal which varies in amplitude with time. It can be seen that this time-varying amplitude creates peaks and valleys where the amplitude variation of the signal changes direction. Some of the peaks positive-going to negative-going reversals are positive as indicated at 56 (assuming that the dotted, horizontal line represents zero volts d.c.) and some of the peaks are negative as indicated at 58. Likewise, some of the valleys (negative-going to positive-going reversals) are negative as indicated at 60, while others are positive as indicated at 62.

With continued reference to FIGS. 1 and 1A, the delayed analog input does not reverse directions until after the analog input has done so, so the two signals cross just after each reversal of the analog input. This crossing of the two signals is a point of equal voltage (or current in the case of current signals). The compare circuit 50 detects this point of equal value (e.g., voltage or current amplitude) and outputs a change of binary state.

It will thus be appreciated that each peak and valley of the analog input signal will be represented by a change in the binary output level of the compare circuit 50 and that the sequence of change in binary levels will represent the time between peaks and valleys of the analog signal. This time information or data is, of course, related to the frequency of the analog signal so the resultant output signal of the compare circuit 50 represents time or frequency information extracted from the analog signal.

The analog input signal, preferably in its delayed form, is applied to the data input terminal of the A/D converter 54. The time data extracted from the analog input is applied to the A/D converter 54 as a trigger to cause the A/D converter 54 to sample the delayed analog signal and provide a digital output signal representative of the amplitude of the delayed analog signal each time the binary time data signal changes binary level. Thus, the time of each peak and valley is available as the time information output signal, and the amplitude of each peak and valley is separately available as the amplitude information signal (not shown in FIG. 1A). Of course, the time and amplitude data for each peak and valley appear almost simultaneously at the respective output terminals since the amplitude data is generated in response to the time data. It will be appreciated by one skilled in the art, however, that certain slight delays may be introduced by the circuits or by methods employed for comparison, sampling, or the like. Delays may be introduced, if necessary, to counteract circuit delays and increase accuracy.

Figure 2:
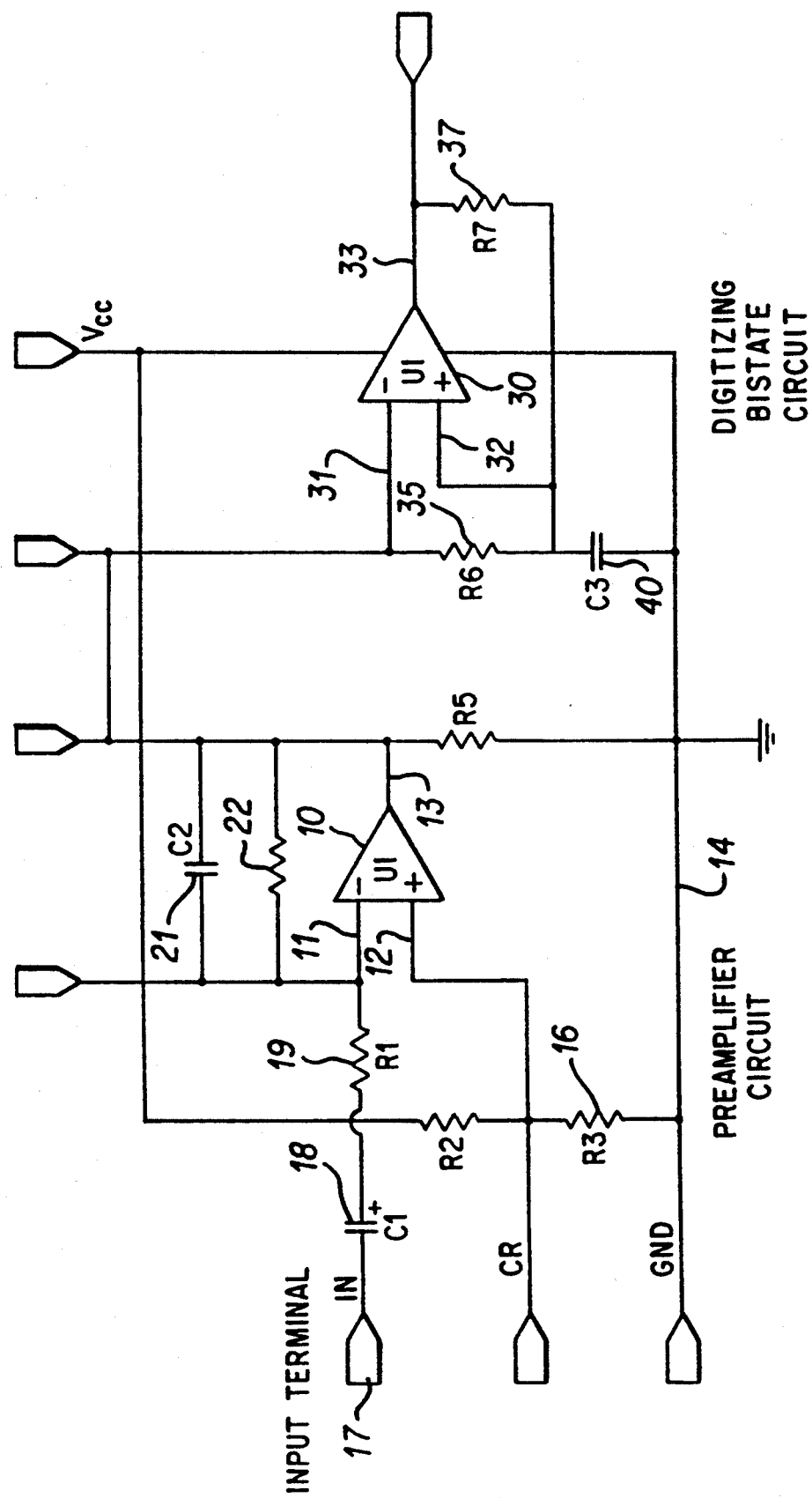
FIG. 2 is a schematic representation of one embodiment of an analog-to-digital converter circuit for extracting time information in accordance with the principles of this invention.

FIG. 2 is a schematic representation of one embodiment of an analog-to-digital converter circuit which is useful for converting an analog signal into a binary signal, at least with respect to the time component of the analog signal. The circuit is provided with a preamplifier 10 having inverting and noninverting inputs 11 and 12, respectively, and an output 13. Noninverting input 12 is coupled to a reference potential 14 via a resistor 16. Inverting input 11 is coupled to an input terminal 17, which receives the analog signal via the series combination of a capacitor 18 and a resistor 19. A feedback capacitor 21 and a feedback resistor 22 are provided across output 13 and inverting input il of preamplifier 10. Output 13 is connected to reference potential 14 via a resistor 23.

FIG. 2 further shows a digitizing portion of a circuit having a digitizing comparator 30 having an inverting input, a noninverting input, and an output, 31, 32, 33, respectively. A resistor 35 is connected across inputs 31 and 32, and a resistor 37 is connected across noninverting input 32 and output 33, whereby resistors 35 and 37 form a resistive voltage divider. The node where resistors 35 and 37 are connected to noninverting input 32 is connected to one end of a capacitor 40 which has its other end connected to reference potential 14. In a preferred embodiment, a time constant produced by the combination of capacitor 40 with resistors 35 and 37 is on the order of microseconds.

The amplified analog signal at output 13 of preamplifier 10 is supplied to inverting input 31 of digitizing comparator 30. Output 33 of digitizing comparator 30 therefore produces the above mentioned binary signal which corresponds in frequency to the analog signal.

Figure 2A:
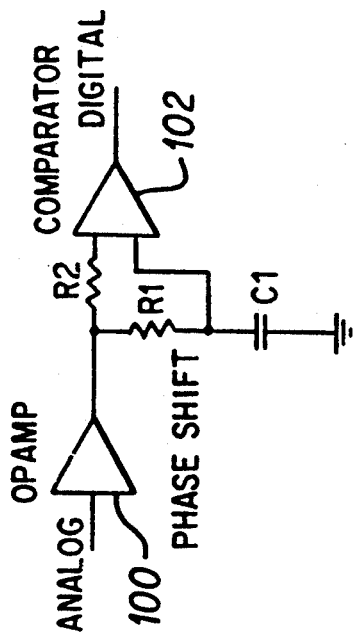
FIG. 2A is a simplified block diagram schematically illustrating the embodiment of FIG. 2.

A simplified block diagram of the embodiment of FIG. 2 is illustrated in FIG. 2A wherein element 100 is a conventional operational amplifier and element 102 is a conventional comparator. In this embodiment, delay is introduced between the signal on one comparator input terminal and the signal on the other comparator input terminal through an RC network comprising resistors R1 and R2 and capacitor C1. Thus, it will be appreciated that the FIG. 2 embodiment represents one simple way to provide a delayed version of the analog input signal through the use of an RC network acting as a delay circuit (i.e., a delay circuit 52 as in FIG. 1).

As mentioned above, the values of the components which introduce the delay are selected to provide a delay on the order of microseconds. This delay will be less than, and preferably quite small in relation to, the time between each peak and valley so that the analog signal and its delayed version cross at places close to the peaks and valleys as shown in FIG. 1A.

Other methods for introducing an appropriate delay between the analog input signal and its delayed version are illustrated in FIGS. 3 to 6 wherein like designations have been used to indicate like components.

Figure 3:
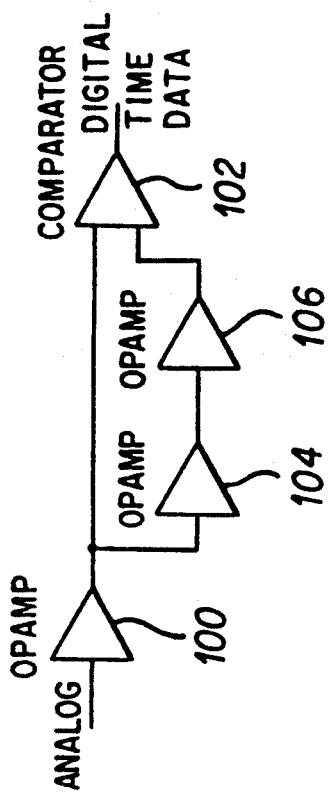
FIGS. 3-6 are schematic representations of further embodiments of time extracting circuits according to the present invention.

Referring to FIG. 3, the analog input signal ANALOG is applied to an operational amplifier 100 for preamplification and, if necessary, impedance matching or isolation. The output signal from the operational amplifier 100 is applied directly to one of the two input terminals of a conventional comparator 102 and to the other of the two input terminals of the comparator 102 via first and second operational amplifiers 104 and 106. A propagation delay phase shift is introduced in the path containing the amplifier 104 and 106, so the signal reaching the comparator 102 along this path is delayed slightly (the amount of the propagation delay of the two amplifiers) with respect to the directly applied analog input signal.

Figure 4:
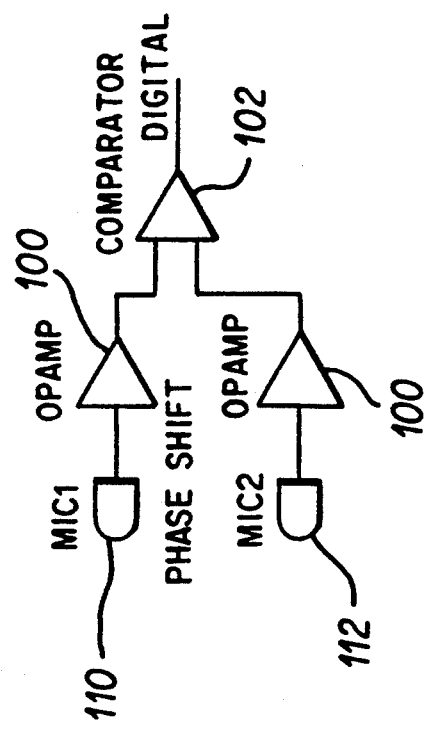

In FIG. 4, a delay or phase shift is introduced between two signals generated by microphones 110 and 112 (MIC 1 and MIC 2) by placing one microphone farther away than the other microphone from the sound source. Thus, if microphone 110 is farther from the sound source, its output signal will be delayed relative to the output signal from microphone 112.

Figure 5:
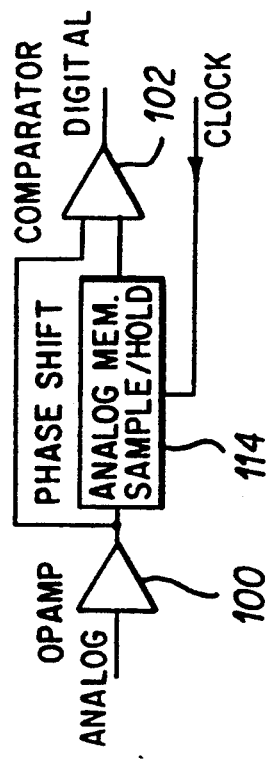

FIG. 5 illustrates an embodiment of a time data extraction circuit which uses an analog sample and hold circuit 119 to introduce a delay. The sample and hold circuit samples and stores the analog signal each time a clock pulse CLOCK is applied. During the interval between clock pulses, the signal level stored by the sample and hold circuit and applied to the comparator 102 remains constant and is always on one side of the analog signal (i.e., greater than or less than) if the analog signal is still changing in the same direction. After a peak or valley is reached, however, the analog signal reverses and the relationship between the stored value and the analog value changes. For example, when a peak is reached, the analog signal, which had been greater than the stored signal, becomes less than the stored signal. This change is detected by the comparator and results in a change in its binary output state.

Figure 6:
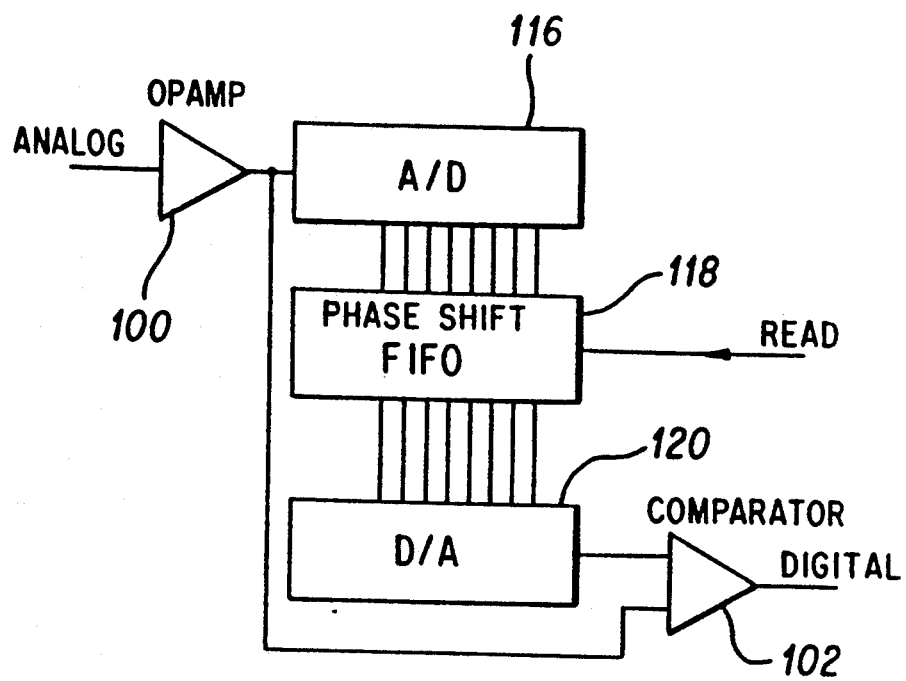

In FIG. 6, a delay is introduced between the analog input signal and the delayed version with which it is compared by a circuit comprising an analog to digital (A/D) converter 116, a first-in, first-out (FIFO) register 118 and a digital to analog (D/A) converter 120. A digital version of the analog input from the A/D converter 116 is clocked into the FIFO by the READ signal. Depending upon the number of stages of the FIFO and the rate of the READ signal, the digital sample of the analog signal is delayed by a predetermined amount, converted back to an analog value, and applied to the comparator 102. The amount of delay thus can be controlled by selection of the rate of the READ signal.

Figure 7:
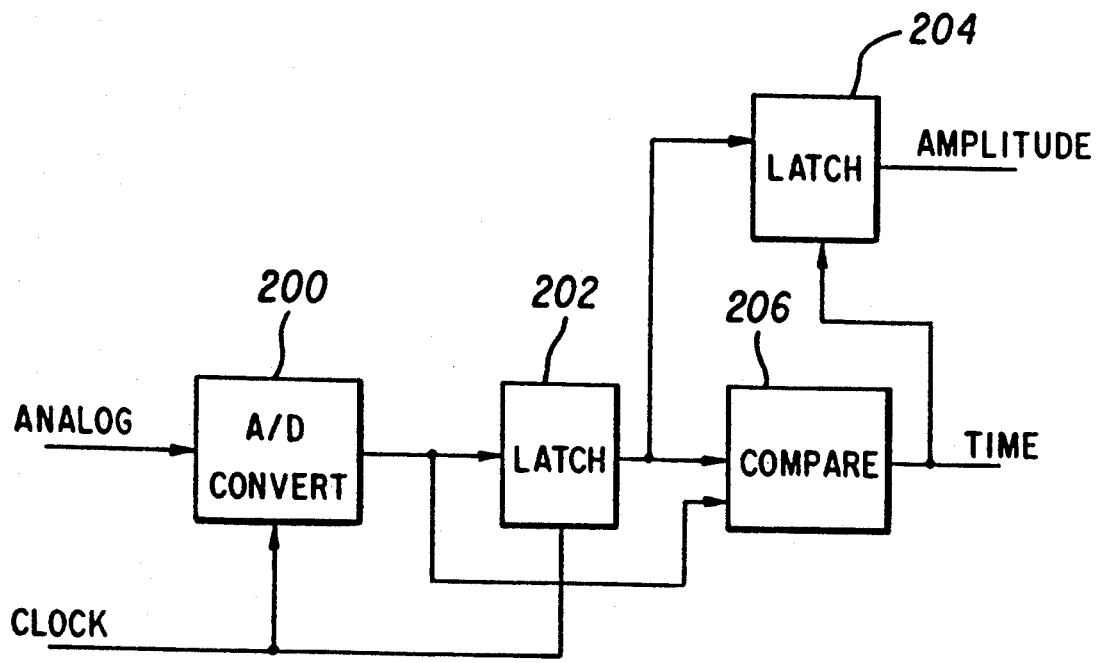
FIG. 7 is a functional block diagram of an embodiment of a time and amplitude extracting circuit according to the present invention.
Figure 8I:
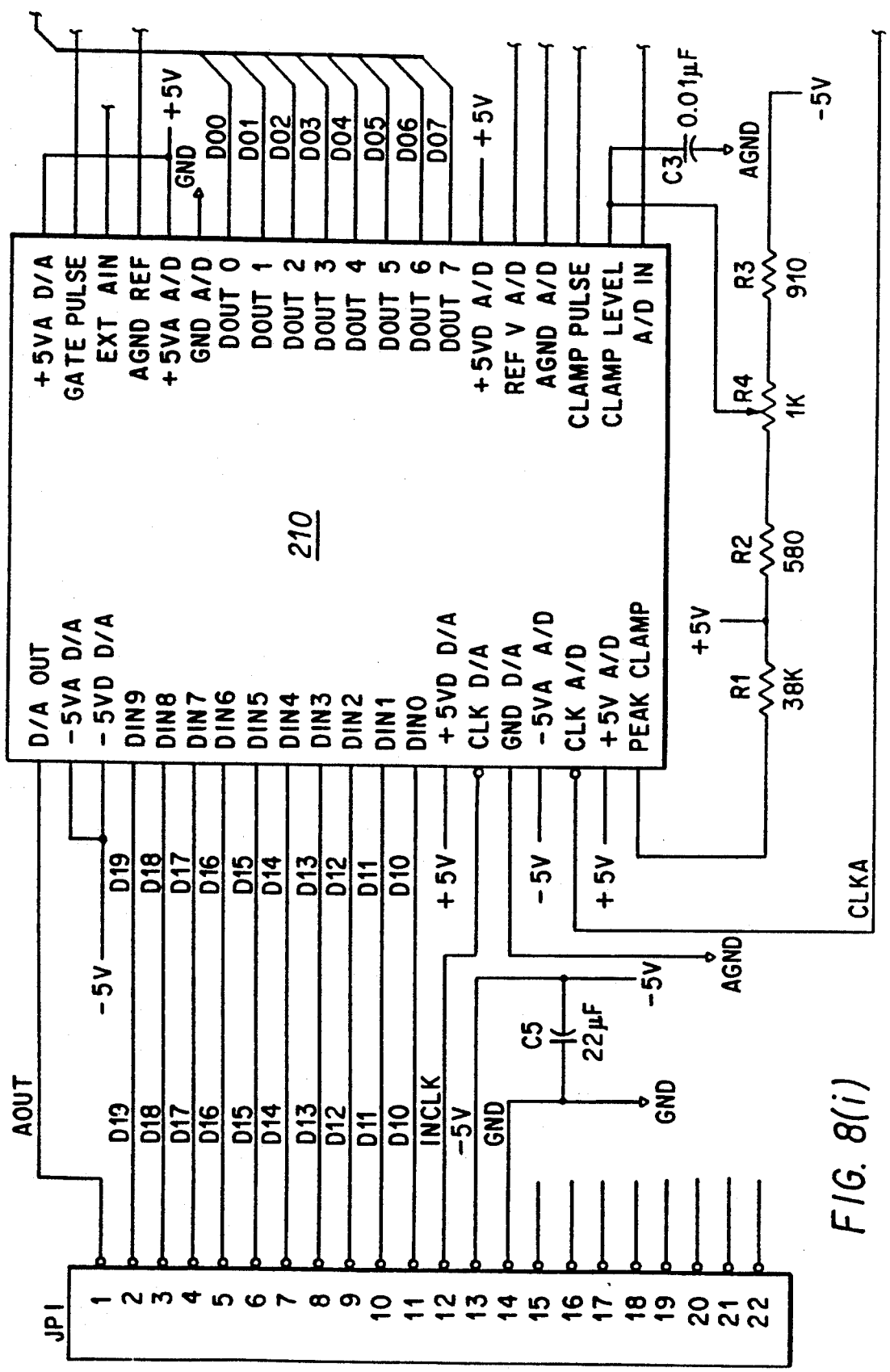
FIGS. 8 (i–iiii) are more detailed schematic diagrams of an embodiment or the according to the principles of FIG. 7.
FIG. 8A is an illustration of typical signal levels at various points in the circuit of FIG. 7.
Figure 8:
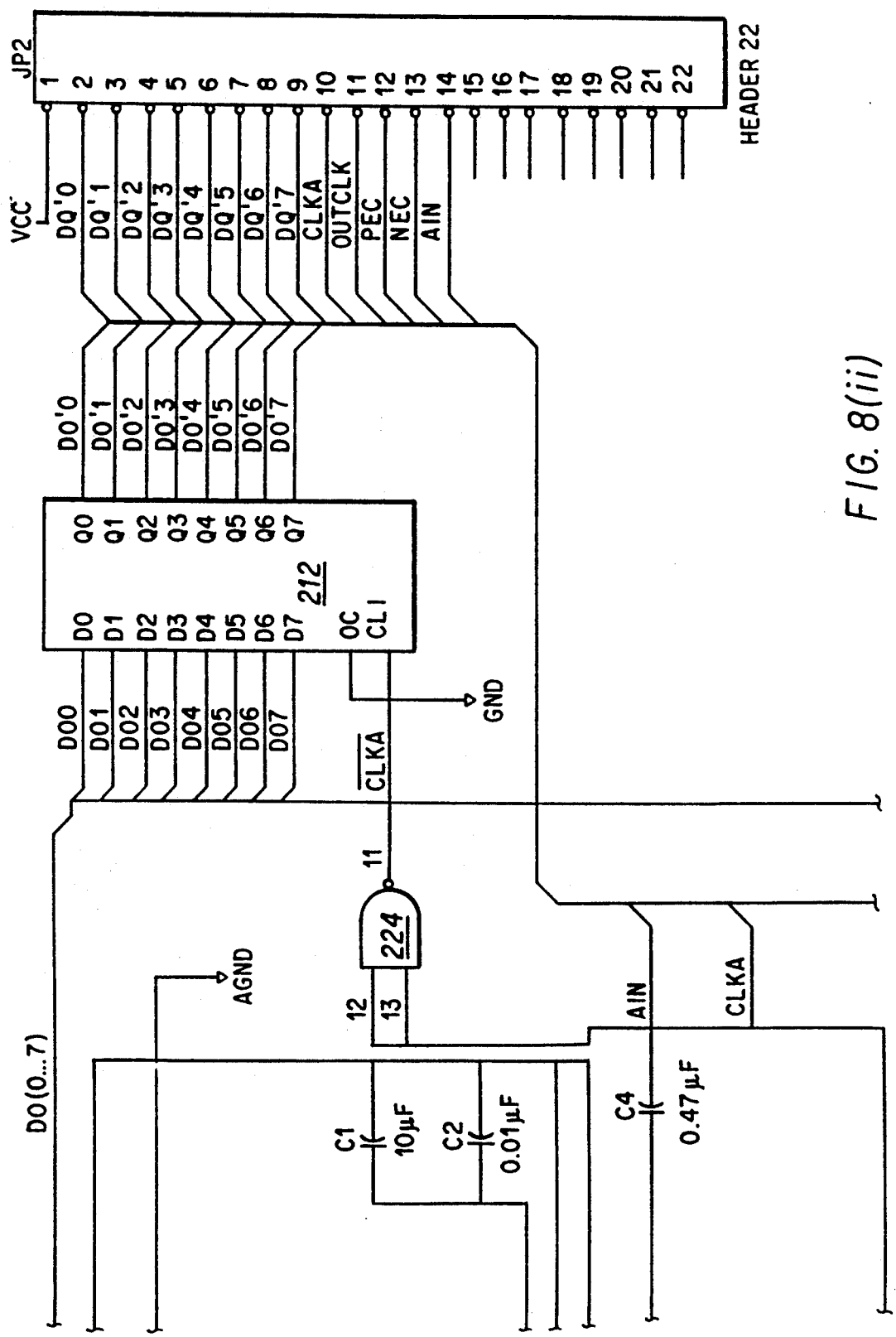

FIG. 7 illustrates a simplified functional block diagram of one embodiment of a time and amplitude extraction circuit according to the invention wherein delay is introduced and comparisons are made between digital signals representing the analog values. FIG. 8 illustrates a more detailed, circuit diagram of an embodiment using this same approach and also including the functional ability to reconstruct the analog signal from the digital time and amplitude components.

Referring first to FIG. 7, the analog input signal is applied to an A/D converter 200 operating at a clock rate preferably more than twice as great as the highest expected frequency of the analog signal. The digital output signal from the A/D converter 200, a sequence of digital representations of the magnitude of the analog signal at regular clock intervals, is applied to the data input terminal of a conventional latch circuit 202, which is clocked by the CLOCK or other suitable enabling signal, in order to temporarily store the digital signals produced by the converter 200. The output signal from the latch 202 is applied to a second latch 204 and to a suitable, conventional digital comparator circuit 206. The digital comparator circuit 206 also receives the digital output signal from the A/D convertor 200, and the latch 204 also receives as an enabling signal the TIME output signal from the comparator 206.

In operation, the input analog signal ANALOG is converted by the A/D converter 200 into a digital form wherein the amplitude of the analog signal at regular sampling intervals (i.e., the CLOCK interval) is represented in digital form by, for example, a four bit binary word. Each digital amplitude value is stored by the latch 202 and thus delayed by the amount of one clock period. Of course, more delay may be introduced, if desired, by having a multi-stage latch.

The comparator 206 compares the delayed amplitude value from the latch 202 with the present or undelayed amplitude value from the converter 200. The comparator 206 may output a pulse or a change in signal level each time the delayed and undelayed amplitude values are equal, although it is preferable in the digital embodiments of FIGS. 7 and 8 to provide an output pulse or change in output signal level each time the difference between the two values changes sign from positive to negative or vice versa.

For example, if the comparator 206 subtracts the delayed signal from the undelayed signal, the difference will be positive or zero when the analog signal amplitude is increasing toward a peak (i.e., has a positive slope). Similarly the difference will be negative or zero when the analog signal amplitude is decreasing toward a valley (i.e., has a negative slope). Each time the analog signal reaches a peak and starts to decrease toward a valley, the difference will change from positive to negative. Similarly, the difference will change from negative to positive when the analog signal reaches a valley and starts to increase toward a peak (see, e.g., FIG. 8A where P represents the undelayed amplitude in digital form and Q represents the delayed amplitude in digital form). Therefore, it will be appreciated that the comparator 206 may subtract the two input signals, detect a change in the sign of the difference of the two input signals, and output a pulse or change in output signal level each time the sign of the difference between the delayed and undelayed amplitude values changes.

With continued reference to FIG. 7, the time output pulse or level change from the comparator 206 is used to trigger or enable the latch 204 so that the latch stores the input signal from the latch 202 at the time of detection of each peak and valley. Thus, the latch 204 stores, in digital form, the delayed amplitude value of the analog input signal at each peak and valley such that the AMPLITUDE signal available in coincidence with the TIME signal represents the amplitude of the peak or valley while the TIME signal represents the time of occurrence of each peak or valley. It will be appreciated that these two output signals are separate and can be separately manipulated, for example, for scrambling purposes or the like. Moreover, the two output signals provide all the information necessary to reconstruct a relatively accurate version of the input analog signal by any suitable digital to analog conversion with suitable smoothing between successive peaks and valleys.

FIG. 8 illustrates an embodiment of the invention like that of FIG. 7 in the sense that the incoming analog signal is converted to digital form and the operations of detecting the times of the peaks and valleys as well as detecting the amplitudes of the peaks and valleys are accomplished by digital signal processing circuits. In addition, the FIG. 8 embodiment includes provision for reconstructing an input analog signal from the digital time and amplitude information extracted from the input analog signal.

Referring to FIG. 8, a suitable, conventional high speed digital to analog (D/A) and analog to digital (A/D) converter 210 includes an analog input terminal A/D IN, digital input terminals DIN0-DIN9, an analog output terminal D/A OUT, digital output terminals DOUT0-DOUT7, a CLK D/A input terminal, and a CLK A/D input terminal, as well as miscellaneous power, ground, and other signals required for proper operation of such devices. The digital output terminals of the converter 210 provide output signals DO0-DO7 to a conventional latch 212 and to one set of input terminals P0-P7 of a conventional digital comparator 214. The delayed digital output signal D0'0-D0'7 from the latch 212 is provided to the other set of input terminals Q0-Q7 of the comparator 214, and the output signals P=Q and P>Q are supplied to the input terminals of a conventional two-input NAND gate 216. A pair of NAND gates 218 and 220 which together form a conventional flip-flop receive the output signal from the NAND gate 216 and the P>Q output signal from the comparator on the respective set and reset inputs thereof. The output signal from the flip flop gate 220 is supplied to the input terminal of a conventional monostable or one-shot multivibrator 222 which in turn provides the time output signal OUTCLK.

Figure 8A:
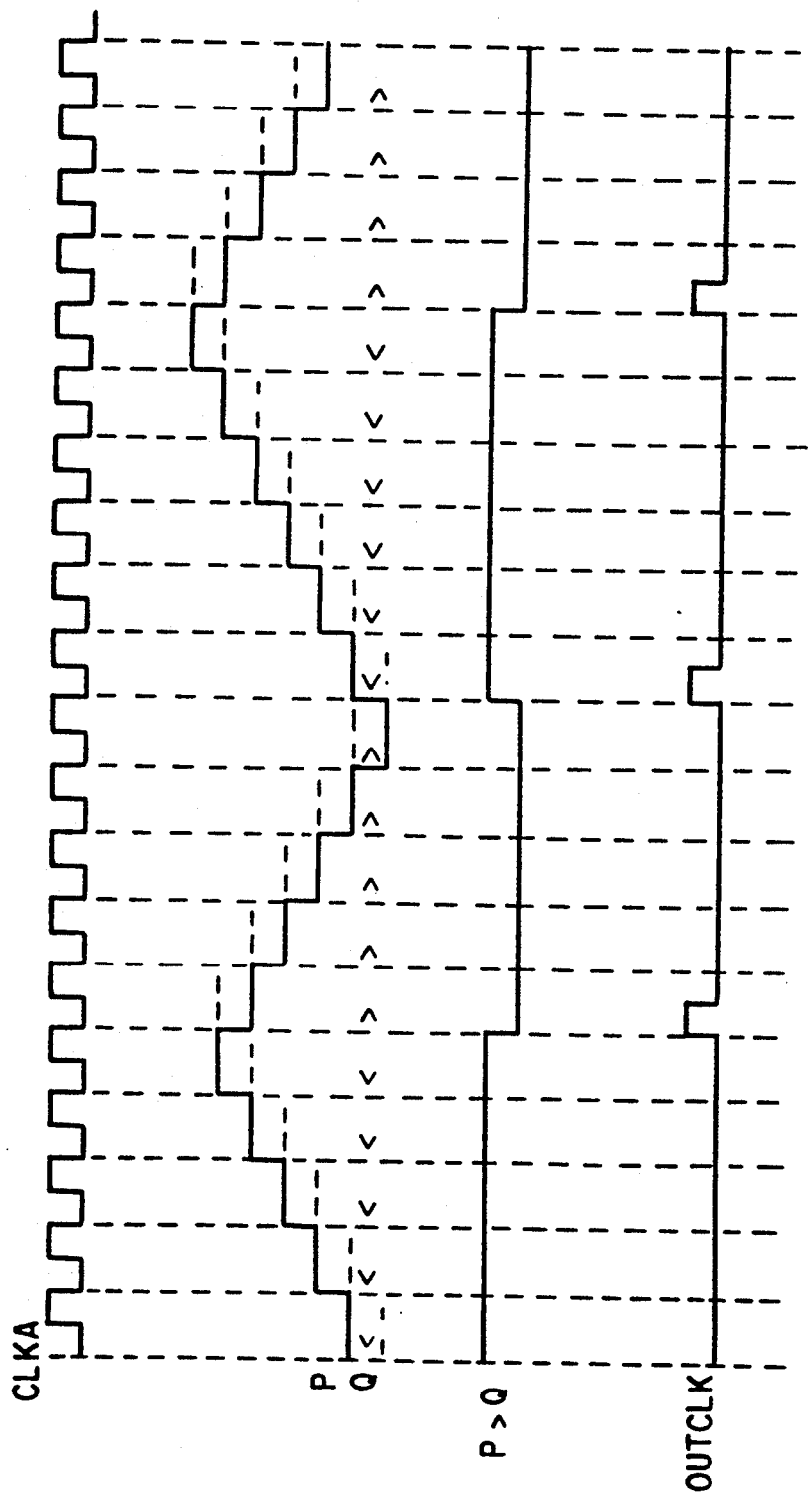

In operation for extracting time and amplitude information from an analog signal, the A/D,D/A converter 210 receives an analog input signal AIN together with a system A/D clock CLKA. The converter 210 samples the analog signal at the input clock rate and provides amplitude values of the analog signal at regular intervals in the form of the output signal DO0-DO7. The DO0-DO7 output signal is delayed by the latch 212 by a time period determined by the clock signal CLKA which is inverted by inverter 224 and applied to the clock input terminal of the latch 212. The delayed and undelayed versions of the amplitude samples Q and P, respectively, are compared by the comparator 214 as is diagrammatically illustrated in FIG. 8A. As a result, the P>Q* (the inverse or "barred" version of the P>Q signal) from the flip flop gate 220 changes level at the occurrence of each peak and valley as shown in FIG. 8A. Since this signal triggers the one shot 222, the output clock signal OUTCLK from the one shot 222 is a pulse which occurs at each peak and valley, and the time between successive OUTCLK pulses represents the time between successive peaks and valleys.

The OUTCLK signal and the D0'0-D0'7 signal thus provide time and amplitude information which may be stored or used as desired. Of course, as in FIG. 7 embodiment, the amplitude value represented by the D0'0-D0-7 output signal may be stored or otherwise used in response to the OUTCLK peak-to-valley time signal if it is desired to store or otherwise process only the peak and valley amplitudes. Similarly, the peak-to-valley time information may be converted from OUTCLK pulses to digital words for storage and later retrieval, e.g., by starting a conventional binary counter in response to each OUTCLK pulse and storing the counter output signal as time data immediately before each OUTCLK pulse restarts the counter.

The mode of operation of the embodiment of FIG. 8 wherein the digital time and amplitude information is used to reconstruct an analog signal will now be explained. Peak and valley amplitude information of an analog signal is supplied from a memory or other source to the DIN input terminals of the converter 210 as the digital input signal DI0-DI7. The time information is supplied to the CLK D/A input terminal of the converter 210 in the form of an input clock signal INCLK derived from the time information corresponding to the amplitude information of the analog signal to be reconstructed. The result will be the analog output signal AOUT from the D/A OUT terminal of the converter 210. This analog output signal will step from peak to valley or valley to peak at each INCLK pulse, so the analog signal may require smoothing or some form of filtering before it is used. In the case of sound, particularly speech, smoothing or filtering may not be necessary because of the limited range of the analog signal, the natural smoothing tendencies of electro-mechanical speakers, and the acceptability of less fidelity with speech than with other analog signals.

It will be appreciated that the present invention has numerous applications, not only in situations where A/D converters normally are useful but in situations where other types of devices might normally be used. The typical application might be, for example, in digital sound recording wherein an analog signal is converted to a digital form for storage on a record medium such as a laser disc. The advantage of the present invention in such an application is, of course, that it may be possible to record music or other sound with sufficiently accurate reproduction using considerably less storage space on the record medium.

Figure 9:
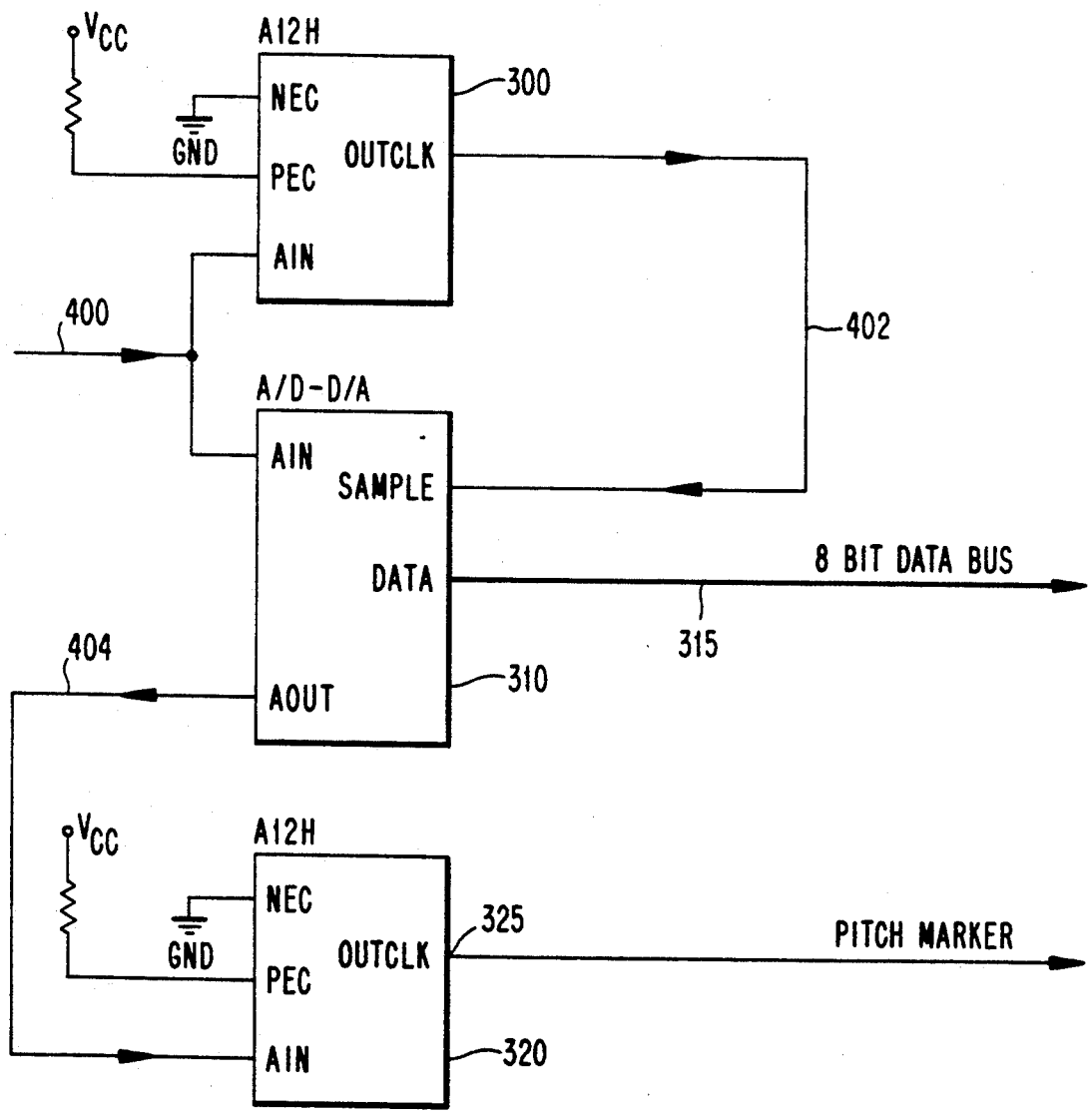
FIG. 9 is a functional block diagram generally illustrating a pitch tracking application of the analog-to-digital signal converter.

An example of how the A12H circuit can be used as part of a speech synthesizer in a pitch tracking circuit is shown in FIG. 9. As is known, the periodicity of a speech segment and its determination is a very important factor in many speech encoding algorithms. The fundamental frequency of the speech signal, designated as F0 and usually called the pitch frequency, is the prime candidate for natural separation of speech segments. The inverse of the pitch frequency, 1/F0, is the pitch period which is generally expressed in samples.

Pitch estimation has remained the most vulnerable part of vocoding systems. The identification of in-between segments is a difficult task and no known algorithm has been found that performs robustly in all cases to allow voice reproduction that is pleasing to human perception.

Figure 10:
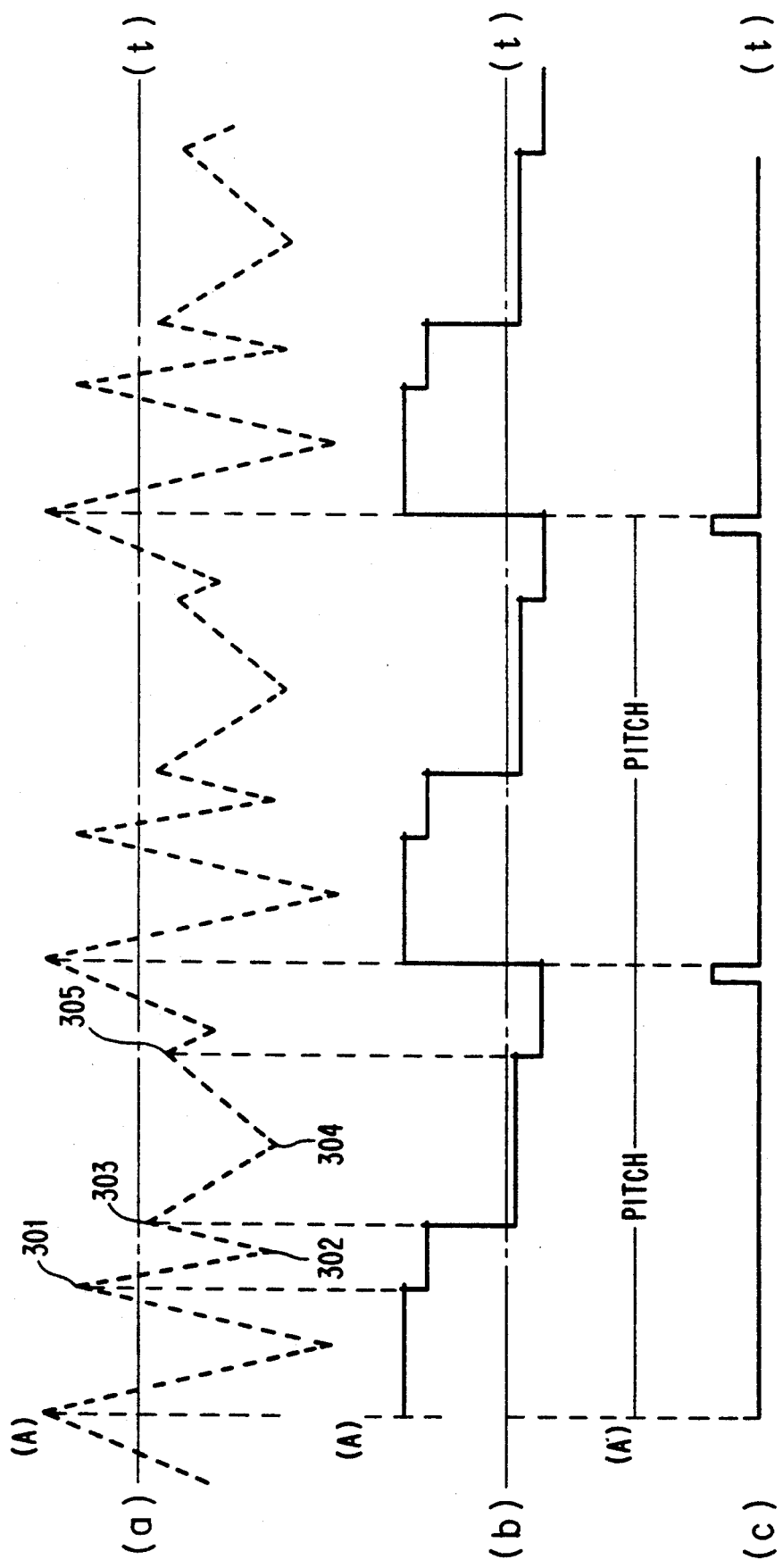
FIG. 10 illustrates typical waveforms processed and generated in accordance with FIG. 9.

Many complex dynamic waveforms are composed of patterns defined by the second or higher order derivative of the waveform. These patterns can be separated using the circuit as shown in FIGS. 9 and 10 (a)-(c). These patterns can then be scaled to compensate for frequency and/or amplitude shifts and compared to a code book for classification. This allows identification of the signal and signal source. Human speech contains these patterns that can be readily used to determine speech content or speaker identification. Since these patterns can be repetitive, only the pattern and number of repetitions need be stored or transmitted to properly recreate the original signal. Very high compression rates can be achieved using this technique for speech encoding.

FIG. 9 illustrates the general arrangement of a pitch tracking circuit using a second order function as an example according to the invention. A first A12H circuit 300 receives an analog voice input signal on line 400 at port AIN. An example of a typical waveform of this type is shown in FIG. 10(a). This first A12H circuit converts the analog signal to a digital signal in the same manner already described, with the exception that only positive peak information (i.e., positive extreme markers) is extracted. Although this embodiment illustrates pattern separation using positive peak information, those skilled in the art will recognize that negative peak information could be extracted instead.

The positive peak extraction is represented diagrammatically in FIG. 9 by the connection of the positive enable port PEC of the A12H to a power source and the connection of the negative enable port NEC to ground. Of the positive peak information extracted by the first A12H 300, only time information is output because amplitude information is captured during the sampling of the initial analog signal as will be discussed below.

Next, the extracted time information of the positive peaks is sent via an output line 402 of the OUTCLK port of the A12H 300 to the SAMPLE port of the A/D-D/A converter 310. This A/D-D/A converter can be any conventionally known component, including the converter 210 shown in FIG. 8(i). Also input to the A/D-D/A converter is the original analog input signal via port AIN. This analog signal is sampled each time a digital pulse of the OUTCLK signal is received at the SAMPLE port.

Each time the analog input signal is sampled, the amplitude of that sample is converted into an 8-bit binary word and output from the DATA port over an 8-bit data bus 315. This data bus can be, for example, connected to a computer or memory device (not shown). At port AOUT of the A/D-D/A converter 310, the analog signal, illustrated in FIG. 10(b), includes only the positive peak amplitude information, for example information relating to the peaks 301, 303 and 305 illustrated in FIG. 10(a). In each of FIGS. 10(a) through 10(c), the horizontal axis represents time (t) while the vertical axis represents amplitude (A).

This analog output signal is passed via line 404 to the AIN port of a second A12H circuit 320. As with the first A12H 300, the second A12H circuit 320 is enabled such that only positive peak information is extracted. In this case, since the time between successive positive peaks of the analog signal indicates pitch markers representing the periodicity of the speech signal, only time information is needed and the amplitude information can be discarded. Thus, the second A12H circuit 320 detects the positive peaks and outputs digital pulses at an OUTCLK port 325 indicative of each peak. Again, this information can be stored by computer or memory device (not shown) in conjunction with corresponding amplitude information previously stored.

The previously segmented time and amplitude information can be scaled in time and/or amplitude for classification or analysis. Human speech contains many speaker dependent characteristics, such as base frequency, rate of speech or amplitude variations that must be corrected to allow code book matching and thereby achieve speaker independent recognition. Uniformly sampled speech can not be adequately scaled due to the lack of absolute time information. The present invention provides all necessary time and amplitude information to allow complete scaling for code book implementation as described below.

By analyzing the human voice through amplitude versus time waveforms, pattern analysis and phonetic classifications can be used to reconstruct or recognize speech. For example, it has been determined that words like "PAY", "DAY" and "SAY" contain 80% of the periodic pattern "AY". For voice synthesis it is not necessary to store the 80% each time it is encountered. Rather, it is sufficient to store one such pitch pattern for the periodic pattern "AY", which can then be accessed each time the particular pattern is encountered and recognized. This type of phonetic classification, storage and retrieval simplifies recognition. If a code book of such time and/or amplitude patterns is collected, speaker identification or speaker independent recognition can be implemented. This circuit and method will also segment any unvoiced signal and therefore speech compression close to 120 bytes per second may be possible.

Although the pattern separation circuit of FIG. 9 has been described with respect to the application of pitch tracking, this application is only intended to illustrate one application of this circuit. The circuit of FIG. 9 can be used to separate patterns in any second or higher order function waveform, for example radar.

The same advantages may be possible in digital communications systems in the sense that the efficiency of the system and/or the bandwidth requirements for transmission of a certain amount of data may be significantly improved if the analog information is converted to a digital form in accordance with the present invention.

Other applications of the present invention which differ from the typical, apparent applications for analog to digital converters may include functions such as demodulation. For example, an amplitude modulated signal may be demodulated by applying it to a circuit according to the present invention and extracting time and amplitude data from the modulated carrier. Since the carrier frequency is constant, the amplitude data will represent the amplitude modulation information on the carrier. Similarly, it will be appreciated that time or phase information can be extracted from an analog signal using the time extraction principles of the present invention. Moreover, as was previously mentioned, highly secure scrambling of an analog signal can be accomplished using a converter according to the present invention since the time and amplitude components are separate and can be independently manipulated and scrambled. This allows a degree of security that may far surpass the typical prior art approaches such as rearrangement of digital words representing amplitude wherein time is always constant as in normal digital versions of analog signals.

Although the invention has been described in terms of specific embodiments and applications, persons skilled in the art, in light of this teaching can generate additional embodiments without exceeding the scope or departing from the spirit of the claimed invention. For example, although the invention has been described in terms of hardware embodiments, it will be appreciated that most if not all of the principles of the invention may be implemented in software. Accordingly, it is to be understood that the drawings and descriptions in this disclosure are proffered to facilitate comprehension of the invention and should not be construed to limit the scope thereof.

What is claimed is:

1. A circuit for representing in digital form, pitch information of an analog time-varying audio input signal, the circuit comprising:

first means for extracting peak time information from the analog time-varying audio input signal and outputting a pulsed signal representing the extracted time information;

means for receiving said output pulsed signal and sampling the analog time-varying audio input signal upon occurrence of each pulse of said output signal to produce a sampled waveform;

means for converting said sampled waveform into an analog signal and outputting said analog signal; and second means for extracting the peak time information from the output analog signal of said converting means and outputting a second pulsed signal representing the extracted information, wherein the time between pulses of said second pulsed signal represents the pitch of the analog time-varying audio signal.

2. The circuit of claim 1 wherein each of said first and second means for extracting peak time information comprise:

means for delaying the analog time-varying audio input signal or the output analog signal, respectively; and means for comparing the magnitude of the analog time-varying input signal or the output analog signal and the delayed analog time-varying audio input signal or the delayed output analog signal, respectively to produce a transition in pulsed output signal each time a differential magnitude of the compared signals has a predetermined value.

3. The circuit of claim 1 wherein means for receiving and sampling and said means for converting comprise an A/D-D/A converter.

4. The circuit of claim 2 wherein said delaying means comprises means for delaying the time-varying input signal by an amount less than the time of one-half of the shortest expected cycle of the time-varying input signal.

5. The circuit of claim 1 including means for outputting a digital representation of the amplitude of the analog time-varying audio input signal each time it is sampled by said receiving and sampling means.

6. The circuit of claim 1 wherein said analog time-varying audio input signal is a speech input signal.

7. A method for representing in digital form, pitch information of an analog time-varying audio input signal, the method comprising the steps of:

extracting peak time information from said analog time-varying audio input signal and outputting a pulsed signal representing the extracted information;

receiving said output signal and sampling the analog time-varying audio input signal each time a pulse from said output signal is received;

converting said sampled signal into an analog signal; and extracting peak time information from said analog signal and outputting a second pulsed signal representing the extracted information, wherein the time between pulses in said second pulsed signal represents the pitch of the analog time-varying audio input signal.

8. The method of claim 6 wherein said steps of extracting peak time information further comprises the steps of:

delaying the analog time-varying audio input signal or said analog signal;

comparing the magnitudes of the analog time-varying audio input signal or the analog signal and the delayed analog time-varying audio input signal or the delayed analog signal, respectively; and producing a transition in a pulsed output signal each time a differential magnitude of the compared signals has a predetermined value.

9. The method of claim 7 wherein said step of receiving and sampling further comprises the step of outputting a digital signal containing the amplitude information of the analog time-varying audio input signal at each sample.

10. The method of claim 8 wherein said step of delaying further comprises the step of delaying the time-varying input signal by an amount less than the time of one-half of the shortest expected cycle of the time-varying input signal.

11. A method of claim 7 wherein said analog time-varying audio input signal is a speech input signal.

* * * * *